(12) United States Patent
Novotny et al.

(10) Patent No.: US 9,423,805 B2
(45) Date of Patent: Aug. 23, 2016

(54) WALL-MOUNTED CONTROLLER WITH A REMOVABLE PORTION

(71) Applicant: Honeywell International Inc., Morristown, NJ (US)

(72) Inventors: Josef Novotny, Kuncina (CZ); Eugene J. Takach, Eden Prairie, MN (US); Arnie P. Kalla, Maple Grove, MN (US); Cary Leen, Hammond, WI (US)

(73) Assignee: Honeywell International Inc., Morris Plains, NJ (US)

( * ) Notice: Subject to any disclaimer, the term of this patent is extended or adjusted under 35 U.S.C. 154(b) by 182 days.

(21) Appl. No.: 13/765,313

(22) Filed: Feb. 12, 2013

(65) Prior Publication Data
US 2014/0226286 A1 Aug. 14, 2014

(51) Int. Cl.
*H05K 5/00* (2006.01)
*G05D 23/19* (2006.01)
*H05K 13/00* (2006.01)

(52) U.S. Cl.
CPC ............ *G05D 23/1902* (2013.01); *H05K 13/00* (2013.01); *Y10T 29/49002* (2015.01)

(58) Field of Classification Search
CPC ....... H05K 5/0004; H05K 5/00; H05K 13/00
USPC .......... 361/747, 759, 725; 29/592.1; 236/94, 236/51
See application file for complete search history.

(56) References Cited

U.S. PATENT DOCUMENTS

| | | | |
|---|---|---|---|
| 364,403 A * | 6/1887 | Stievenart | F22B 5/02 122/207 |
| 2,775,781 A * | 1/1957 | Morgan | A47B 1/02 16/86 C |
| 2,789,160 A | 4/1957 | Gage | |
| 4,152,551 A | 5/1979 | Hiller | |
| 4,295,180 A | 10/1981 | Herron et al. | |
| 4,300,199 A | 11/1981 | Yoknis et al. | |
| 4,391,883 A | 7/1983 | Williamson et al. | |
| 4,394,708 A | 7/1983 | Kasprzyk | |
| 4,431,114 A * | 2/1984 | Kleinfeld | 220/835 |
| 4,506,827 A | 3/1985 | Jamieson et al. | |
| 4,641,370 A | 2/1987 | Oyamada | |
| 4,751,961 A | 6/1988 | Levine et al. | |
| 4,885,219 A | 12/1989 | Miller | |
| 4,904,549 A | 2/1990 | Goodwin et al. | |
| 4,959,640 A | 9/1990 | Hall | |

(Continued)

FOREIGN PATENT DOCUMENTS

WO WO 2013093109 A1 * 6/2013

OTHER PUBLICATIONS

Photograph of Honeywell Thermostat, Chromotherm III T8600C90099547, 1 page, prior to Jul. 14, 2006.

(Continued)

*Primary Examiner* — Dion R Ferguson
*Assistant Examiner* — Mandeep S Buttar
(74) *Attorney, Agent, or Firm* — Seager, Tufte & Wickhem, LLP

(57) ABSTRACT

An example wall-mountable HVAC controller may include a controller module and a wall plate, with a hinge that allows the controller module to rotate relative to the wall plate. The hinge may provide an end stop that limits the rotation of the controller module relative to the wall plate, and/or may allow the controller module to be freely pulled away and disengaged from the wall plate if desired.

19 Claims, 7 Drawing Sheets

(56) References Cited

U.S. PATENT DOCUMENTS

| | | |
|---|---|---|
| 4,972,508 A | 11/1990 | King |
| 4,991,225 A | 2/1991 | Holcomb et al. |
| 5,061,023 A * | 10/1991 | Soubliere ............... E05D 1/04 16/355 |
| 5,099,390 A | 3/1992 | Michaud |
| 5,107,918 A | 4/1992 | McFarlane et al. |
| 5,193,051 A | 3/1993 | Ma |
| 5,198,638 A | 3/1993 | Massacesi et al. |
| 5,244,755 A | 9/1993 | Benoist et al. |
| 5,280,273 A | 1/1994 | Goldstein |
| 5,281,954 A | 1/1994 | Harrison et al. |
| 5,337,215 A | 8/1994 | Sunderland et al. |
| 5,482,209 A * | 1/1996 | Cochran ............ G05D 23/1904 165/11.1 |
| 5,485,954 A | 1/1996 | Guy et al. |
| 5,644,302 A | 7/1997 | Hana et al. |
| 5,673,850 A | 10/1997 | Uptegraph |
| 5,729,442 A | 3/1998 | Frantz |
| 5,804,332 A | 9/1998 | Shimizu et al. |
| 5,927,599 A | 7/1999 | Kath et al. |
| 6,120,932 A | 9/2000 | Slipy et al. |
| 6,362,953 B1 | 3/2002 | Ohlwine et al. |
| 6,398,594 B1 | 6/2002 | Bonilla et al. |
| 6,428,924 B1 | 8/2002 | Suganuma et al. |
| 6,636,018 B2 | 10/2003 | Hirota |
| 6,757,155 B2 | 6/2004 | Koike et al. |
| 7,210,963 B2 | 5/2007 | Chintala et al. |
| 7,633,743 B2 | 12/2009 | Barton et al. |
| 7,832,652 B2 | 11/2010 | Barton et al. |
| 7,963,453 B2 | 6/2011 | Peterson et al. |
| 2002/0160255 A1 | 10/2002 | Babcock et al. |
| 2004/0048638 A1 | 3/2004 | Inomata et al. |
| 2006/0071087 A1 | 4/2006 | Kates |
| 2006/0172182 A1 * | 8/2006 | Barton et al. .................. 429/96 |
| 2006/0192022 A1 * | 8/2006 | Barton et al. .................. 236/94 |
| 2008/0013259 A1 * | 1/2008 | Barton et al. ................ 361/679 |

OTHER PUBLICATIONS

Photograph of Honeywell Thermostat, CT3611R44500329, 1 page, prior to Jul. 14, 2006.
Photograph of Honeywell Thermostat, SN28002, 1 page, prior to Jul. 14, 2006.
Photograph of Honeywell Thermostat, T8511M10020 149, prior to Jul. 14, 2006.
Photograph of Honeywell Thermostat, TH3110, prior to Jul. 14, 2006.
Photograph of Honeywell Thermostat, TH5110, prior to Jul. 14, 2006.
Photograph of Honeywell Thermostat, TH6220D10280515, prior to Jul. 14, 2006.
Photograph of Honeywell Thermostat, TH832041 0080448, prior to Jul. 14, 2006.
Photograph of Hunter Thermostat, Model 44100, prior to Jul. 14, 2006.
Photograph of Lux Thermostat, Model1500, prior to Jul. 14, 2006.
Photograph of Ritetemp Thermostat, Model 8030, prior to Jul. 14, 2006.
Photograph of White Rodgers Thermostat, Model1F95, prior to Jul. 14, 2006.
Install Guide for Ritetemp Thermostat 8082, 6 pages, prior to Jul. 14, 2006.
White Rodgers, "90 Series Blue Single Stage Thermostat with Automatic Heat/Cool Changeover Option," 8 pages, prior to Jul. 14, 2006.

* cited by examiner

WALL-MOUNTED CONTROLLER WITH A REMOVABLE PORTION

TECHNICAL FIELD

The disclosure relates generally to wall mounted controllers, and more particularly, to wall mounted controllers that have a removable portion.

BACKGROUND

HVAC controllers are commonly used in dwellings, buildings, and other controlled spaces for controlling the temperature, humidity and/or other environmental parameters within the space. In many cases, such HVAC controllers are mounted to a wall in the controlled space. When so provided, the HVAC controllers often have a wall plate sub-assembly or the like that is mounted to the wall, and a removable sub-assembly portion that is removably mounted to the wall plate sub-assembly. The removable sub-assembly portion often includes control electronics, sensors and/or a user interface.

There are many reasons why a user might want to remove the removable sub-assembly portion from a wall plate sub-assembly or the like of a wall-mounted HVAC controller. For example, many HVAC controllers use a battery as a main power source and/or back-up power source. When so provided, the battery often needs to be replaced periodically. In some cases, the removable sub-assembly portion must be removed from a wall plate sub-assembly to gain access to a battery compartment.

Also, in some cases, HVAC controllers can be programmed by a user via a user interface of the removable sub-assembly portion. For convenience, the user may want to remove the removable sub-assembly portion from the wall plate sub-assembly or the like to program the HVAC controller while sitting in a chair. Once programmed, the user may reinstall the removable sub-assembly portion on the wall plate sub-assembly or the like, and the HVAC controller may begin controlling according to the programmed settings. Other reasons for wanting to remove a removable sub-assembly portion from a wall plate sub-assembly or the like may include, but are not limited to, checking the wiring of the HVAC system, accessing seldom-used features that may be located on a non-outward facing part of the HVAC controller, as well as other reasons.

What would be desirable is a wall-mountable HVAC controller that allows for easier and/or more convenient removal of a removable sub-assembly portion.

SUMMARY

The disclosure relates generally to wall mounted controllers, and more particularly, to wall mounted controllers that include hinged attachment features. In one example, a wall-mountable HVAC controller has a wall plate, a controller module, and a latch. The controller module may be configured to be releasably securable to the wall plate. The wall plate may be configured to be secured to a wall, and may include one or more first hinge structures. The controller module may include one or more second hinge structures that are configured to engage the one or more first hinge structures of the wall plate to form a hinge between the controller module and the wall plate. In some instances, the hinge may allow the controller module to rotate relative to the wall plate about a rotation axis and away from the wall. The one or more first hinge structures of the wall plate and the one or more second hinge structures of the controller module may be configured such that the hinge provides an end stop that limits the rotation of the controller module relative to the wall plate.

The controller module may be securable to the wall plate by both the latch and the hinge attachment features. When the controller module is secured to the wall plate by the latch and the hinge, releasing the latch may allow the controller module to be rotated relative to the wall plate about the rotation axis of the hinge and away from the wall. The one or more first hinge structures of the wall plate and the one or more second hinge structures of the controller module may be configured such that, after the latch releases the controller module from the wall plate and the controller module begins rotating away from the wall, the controller module can be freely pulled away by a user and disengaged from the wall plate.

In some embodiments, the rotation axis of the hinge does not intersect the wall plate or the controller module. In some instances, at least some of the one or more first hinge structures and the one or more second hinge structures are structured with sufficient flexibility and/or lubricity that if a force is exerted on the controller module so as to rotate the controller module relative to the wall plate past the end stop, the hinge may release without breakage of any of the one or more first hinge structures and the one or more second hinge structures.

In some instances, a wall-mountable HVAC controller may include a wall plate, a controller module, and a connector. The wall plate may include one or more first hinge structures and may be configured to be secured to a wall. The controller module may be configured to be releasably securable to the wall plate. The controller module may include one or more second hinge structures configured to engage the one or more first hinge structures to form a hinge between the controller module and the wall plate. The hinge may allow the controller module to rotate relative to the wall plate about a rotation axis and away from the wall. The connector may be for electrical and/or optical signals, and may include a first connector portion attached to the wall plate and a second connector portion attached to the controller module. The first connector portion and second connector portion may be configured to automatically mate and de-mate as the controller module is rotated toward and away from the wall plate, respectively. The one or more first hinge structures of the wall plate and the one or more second hinge structures of the controller module may be configured such that, while rotating about the rotation axis, the controller module can be freely pulled away by a user and disengaged from the wall plate.

In some cases, the wall plate and the controller module may have cooperating hinge structures that form a hinge with an open stopped position that allows the controller module to be suspended from the wall plate at the open stopped position after a release mechanism (e.g. a latch) is actuated. The hinge may also allow the suspended controller module to be lifted freely from the wall plate. When so provided, and starting from a state where the controller module is secured to the wall plate, the release mechanism (e.g. latch) may be actuated. In some cases, actuating the release mechanism may be performed with a single human finger. After actuating the release mechanism, the controller module may be allowed to rotate to the open stopped position. The controller module may be lifted away from the wall plate from the open stopped position. In some cases, the controller module may be lifted away from the wall plate from another rotational displacement of the controller module relative to the wall plate, or at any rotational displacement of the controller module relative to the wall plate along the range of rotational displacements. In any event, after the controller module is lifted away from the wall plate, maintenance tasks may be performed, such as removing one or more batteries from the controller module and placing one or more new batteries into the controller module, and/or programming the controller module via a user interface of the controller module. After maintenance is performed, the cooperating hinge structures of the wall plate and the controller module may be mated, and the controller module may be rotated about the hinge until the controller module is secure against the wall plate via the release mechanism (e.g. latch).

The above summary is not intended to describe each and every example or every implementation of the disclosure. The Description that follows more particularly exemplifies various illustrative embodiments.

BRIEF DESCRIPTION OF THE FIGURES

The following description should be read with reference to the drawings. The drawings, which are not necessarily to scale, depict several examples and are not intended to limit the scope of the disclosure. The disclosure may be more completely understood in consideration of the following description with respect to various examples in connection with the accompanying drawings, in which.

DESCRIPTION

The following description should be read with reference to the drawings, in which like elements in different drawings are numbered in like fashion. The drawings, which are not necessarily to scale, depict selected illustrative embodiments and are not intended to limit the scope of the disclosure. Although examples of construction, dimensions, and materials are illustrated for the various elements, those skilled in the art will recognize that many of the examples provided have suitable alternatives that may be utilized.

Figure 1:
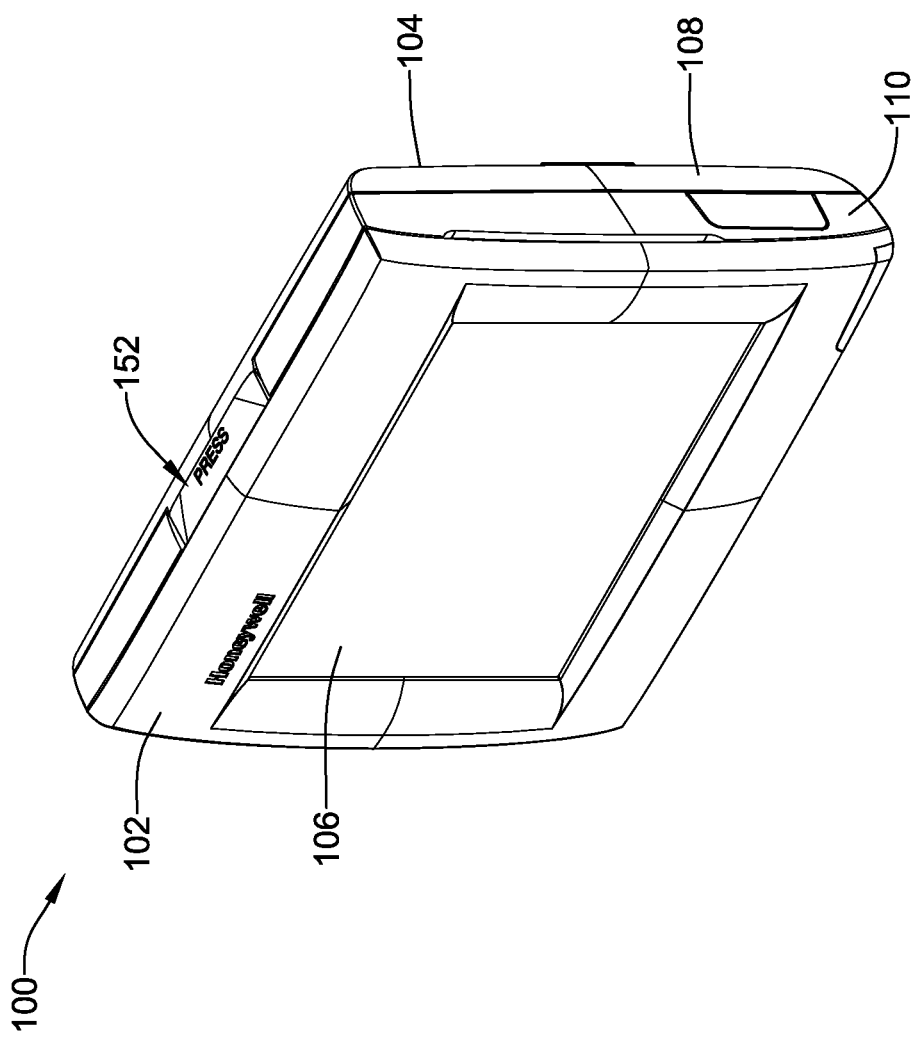
FIG. 1 is a schematic perspective view of an illustrative HVAC controller.

FIG. 1 is a schematic perspective view of an illustrative but non-limiting HVAC controller 100. HVAC controller 100 may be or may include a thermostat, for example, and may be configured to interact with and control HVAC equipment, such as heating equipment, cooling equipment, and ventilation equipment, humidification equipment, and the like. Such HVAC equipment may be located remotely from HVAC controller 100. While an HVAC controller 100 is used here as an example, it is contemplated that the devices and methods of the present disclosure may be practiced with other types of wall mounted controllers such as security system controllers, lawn sprinkler controllers, lighting controllers and/or any other suitable wall-mountable controllers, such as environmental monitors, surveillance devices, digital picture frames, wireless network routers, and so on.

As such in FIG. 1, HVAC controller 100 may include an enclosure 102 that is configured to be mounted to a wall (not shown) on wall-facing side 104. The enclosure 102 may generally present a substantially smooth outer surface, without exhibiting sharp projections that disrupt a visual and/or tactile sense of smoothness, but this is not required. The projection of the outer surface onto a given plane, such as a wall to which the HVAC controller 100 may be mounted, may define a perimeter of the HVAC controller 100.

Figure 2:
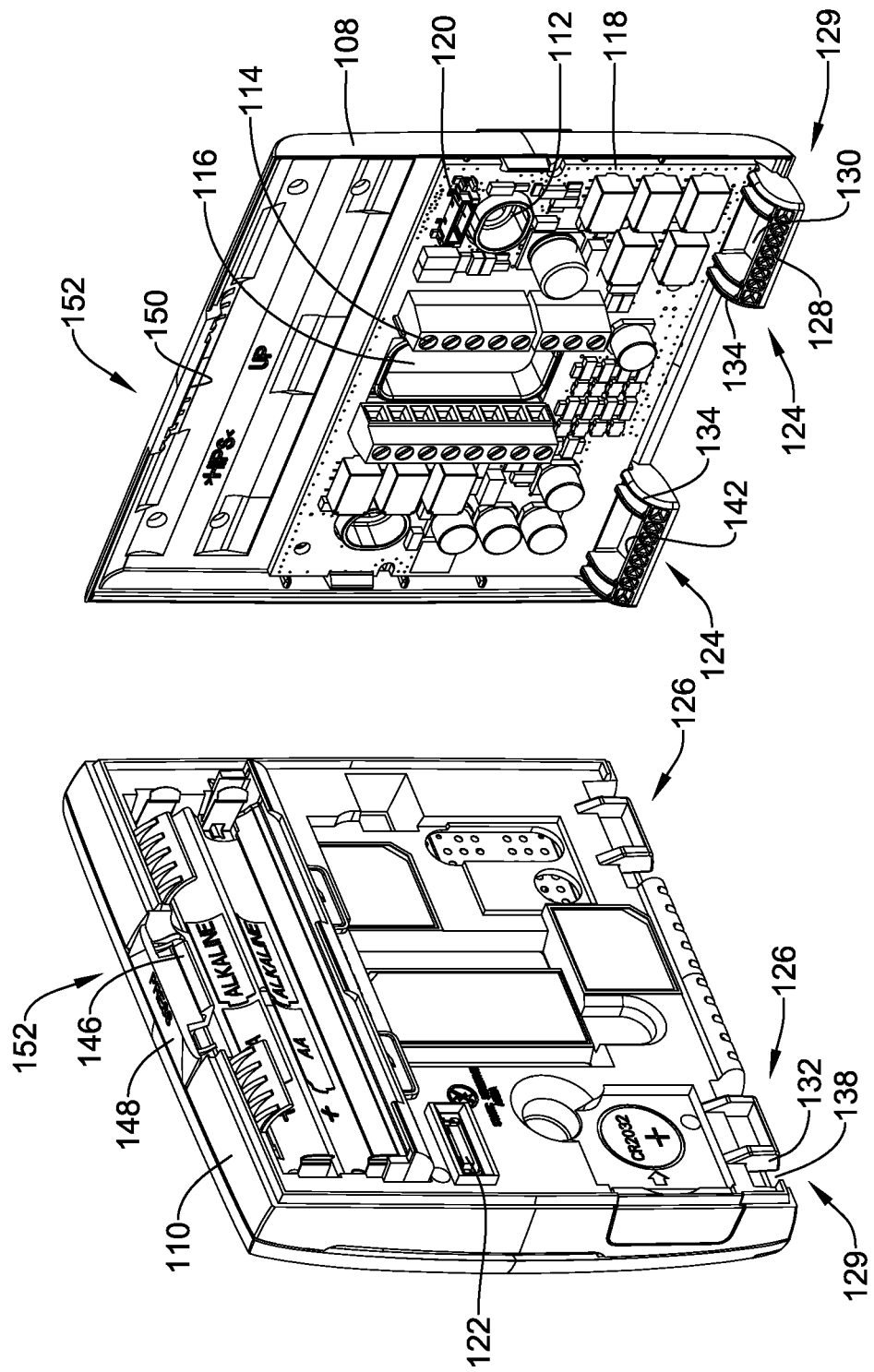
FIG. 2 is a schematic perspective view of the illustrative HVAC controller of FIG. 1 with a wall plate separated from a controller module.

HVAC controller 100 may include a user interface, which may include any suitable combination of displays, buttons, switches, and the like. In HVAC controller 100 of FIG. 1, the user interface may include a touch screen 106 disposed on the front side of the HVAC controller 100. HVAC controller 100 may be attached or secured to a wall via a wall plate 108 to which a controller module 110 may be releasably secured. FIG. 2 is a schematic perspective view of illustrative HVAC controller 100 of FIG. 1 with wall plate 108 and controller module 110 separated.

Wall plate 108 may configured to be secured to a wall (the wall is not explicitly shown) in any suitable way. Toward this end, wall plate 108 may include one or more attachment holes 112 for receiving screws or the like that are used to secure the wall plate 108 to the wall. Wall plate 108 may also include one or more terminals 114 configured to receive a signal-carrying medium (such as a conductive thermostat wire or an optical fiber, or sub-portion thereof, or any other suitable tangible signal-carrying medium that might reasonably be described as a signal-carrying medium), from external the HVAC controller 100. The one or more terminals 114 may be designed to allow an installer to attach the signal-carrying medium to the terminals 114. In some cases, signal-carrying medium and the like may enter the HVAC controller 100 via opening 116 in wall plate 108. Signal-carrying medium that is attached to the terminals 114 may be configured to convey at least one of power and/or control signals between the HVAC controller 100 and remote HVAC equipment (not shown). Terminals 114 may be mounted to or disposed upon a printed circuit board 118. Printed circuit board 118, or another circuit board, may also include a connector portion 120 configured to mate with another connector portion 122 of the controller module 110. In some cases, the connector portions 120, 122 may include a number of conductors or optical interconnects sufficient to correspond to at least some of the one or more terminals 114, but this is not required.

HVAC controller 100 may be structured such that controller module 110 is configured to be releasably securable to the wall plate 108. The wall plate 108 may be a sub-assembly of the HVAC controller 100. Likewise, the controller module 110 may be considered a sub-assembly of the HVAC controller 100, and may be removable from the wall plate sub-assembly. In any event, in some instances, wall plate 108 and controller module 110 may include a number of cooperating features, including a hinge 129 and a latch 152. Wall plate 108 may include one or more first hinge structures 124, and controller module 110 may include one or more second hinge structures 126. First hinge structures 124 and second hinge structures 126 may be configured to engage, mate, and cooperate with each other, as discussed further herein, to form a hinge 129 between the controller module 110 and the wall plate 108.

While the example shown in the Figures includes two first hinge structures 124 and two corresponding second hinge structures 126, more or fewer hinge structures may be employed as desired. For example, in some instances, a single first hinge structure on a wall plate and single second hinge structure on a controller module may be provided. On another example, three or more hinge structures on each part (wall plate and/or controller module) may be provided. Furthermore, depending on the particulars of how the hinge structures cooperate and engage, in some instances, the numbers of hinge structures on the wall plate and controller module may not necessarily be equal, with, for example, multiple hinge structures on one part engaging with a single hinge structure on the other. The quantity of hinge structures counted may depend on the particulars of what features are defined as being included in each individual hinge structure.

Figure 5:
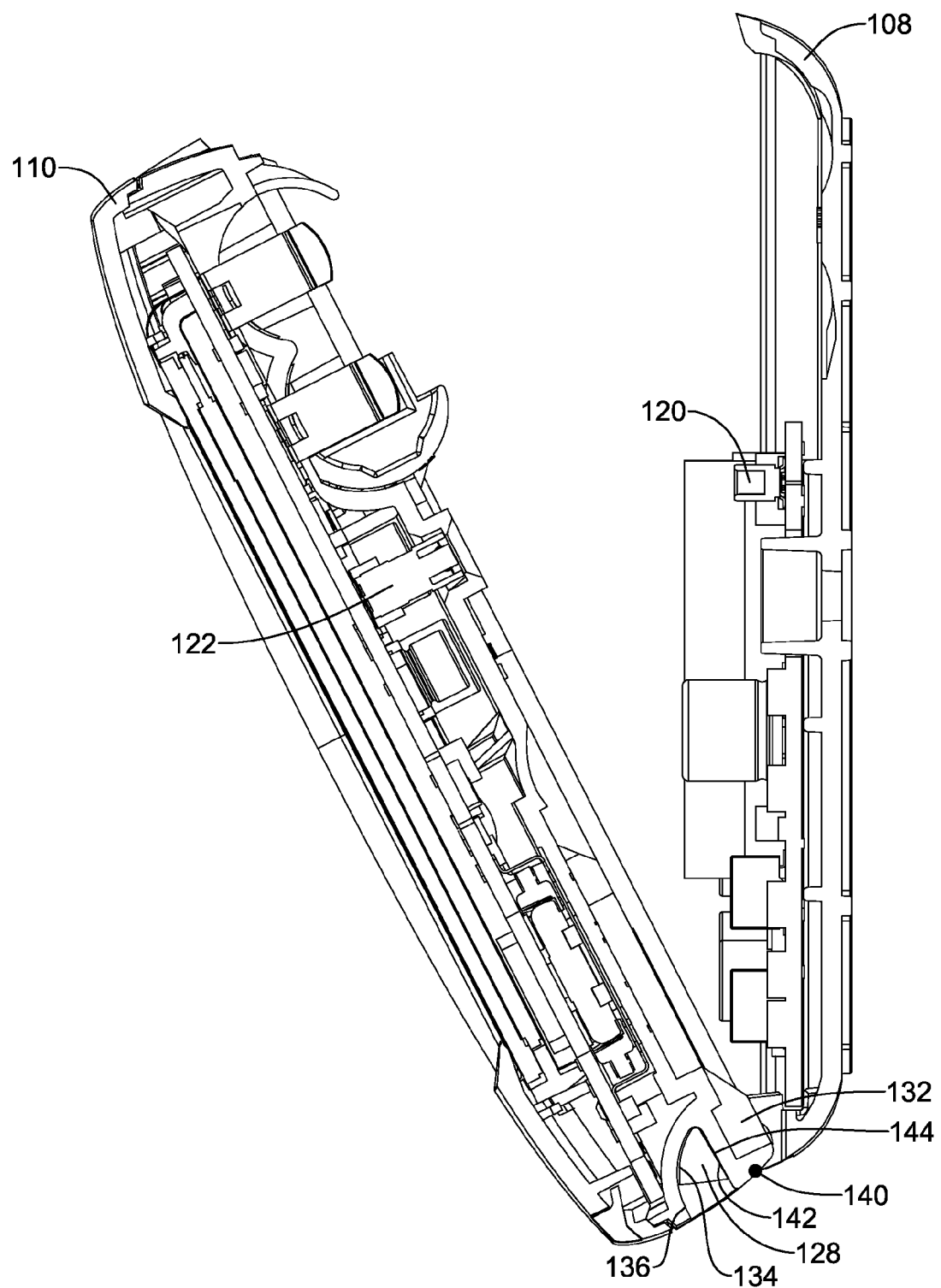
FIG. 5 is a schematic cutaway view of the HVAC controller of FIGS. 1-4 with the controller module rotated away from the wall plate.

In the example shown in the Figures, the first hinge structures 124 of wall plate 108 and the second hinge structures 126 of controller module 110 are disposed along or adjacent to a bottom side or edge of HVAC controller 100. In some instances, hinge structures may generally be disposed along or adjacent an edge or side of the HVAC controller 100 other than the bottom. As discussed elsewhere herein, the disposition of the hinge structures 124, 126 adjacent the bottom side of HVAC controller 100 may result in features of hinge operation particular to such placement (due to, for example, gravity) that may not be present or relevant in examples where the hinge structures are elsewhere disposed. Regardless of what side the hinge structures may be disposed, hinges such as that formed by first hinge structures 124 and second hinge structures 126 may allow a controller module 110 to rotate or pivot away from the corresponding wall plate 108 (and thus away from the wall to which the wall plate 108 may be secured), with the side opposite the hinge 129 undergoing the greatest linear displacement. For the HVAC controller 100 shown in the Figures, the top of the controller module 110 may undergo the greatest linear displacement as the controller module 110 rotates away from the wall plate 108. When the wall plate 108 is mounted to a wall (wall not shown), the top of the controller module 110 may be rotatable away from the wall plate 108 under gravity at least until engaging an end stop, discussed elsewhere herein. FIG. 5 illustrates the controller module 110 pivoted away from the wall plate 108 and against the end stop.

Figure 3:
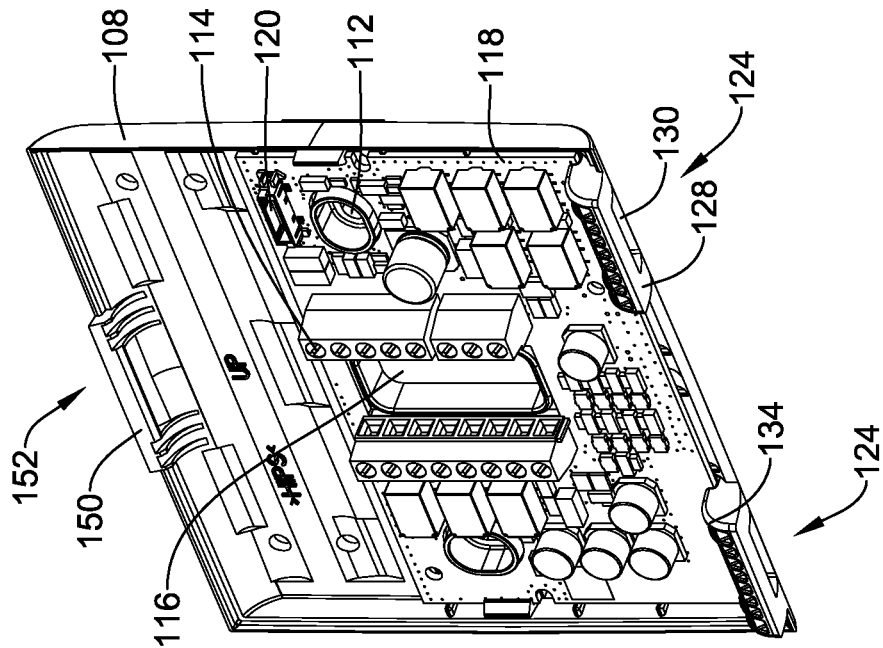
FIG. 3 is a schematic perspective view similar to that of FIG. 2 from a lower viewpoint.
Figure 3:
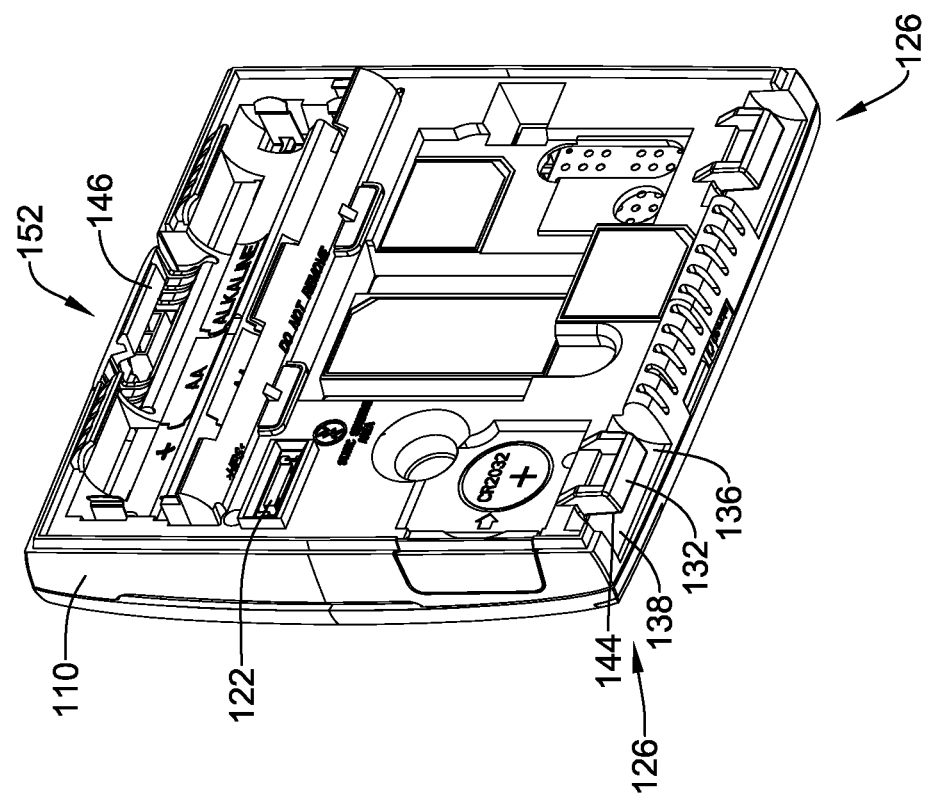

The hinge structures may take any suitable form to provide a hinge 129. Features of the hinge structures 124, 126 of the example shown in the Figures may be seen, for example, in FIG. 2 and in FIG. 3. FIG. 3 provides a perspective view of HVAC controller 100 similar to that of FIG. 2, but from a lower viewpoint. As illustrated, each first hinge structure 124 of wall plate 108 includes a loop 128 that defines an opening 130. Each second hinge structure 126 of controller module 110 includes a tang 132. Tang 132 is configured to extend into the opening 130 of the loop 128 such that the tang and opening cooperatively mate as part of the hinge structure. In some instances, the provision of receptacles and tangs on wall plates and controller modules may be reversed compared to the configuration illustrated in the Figures, with tang(s) provided on wall plates and receptacles on controller modules. In some instances, the disposition of tangs and receptacles on wall plates and controller modules may be mixed without departing from the spirit and scope of the present disclosure. For example, a wall plate having one hinge structure with a receptacle and another hinge structure with a tang, and with a controller module having corresponding hinge structures to mate with those of its wall plate. In embodiments in which hinge structures may be disposed other than on a bottom side, variations relative to the hinge structures described herein and shown in the Figures may be practiced. For example, hinge structures along the top side of a controller module 110 may have tangs that point upward and generally away from the center of the controller module 110, compared with the hinge structures of HVAC controller 100 of the Figures, in which tangs point upward and generally inward toward the center of the controller module 110. Given the guidance of the present disclosure, one of skill in the art may readily perceive the various modifications to the hinge structures that may be practiced in alternative forms within the scope of the present disclosure. It is noted that in some instances, rather than providing loops with complete through openings, cups with recesses may be provided to provide essentially equivalent functionality, with corresponding adjustments made to the geometry of the corresponding tangs. Also, while not explicitly shown, the loops 128 need not be continuous loops, but rather may include a break or slot if desired.

Figure 4:
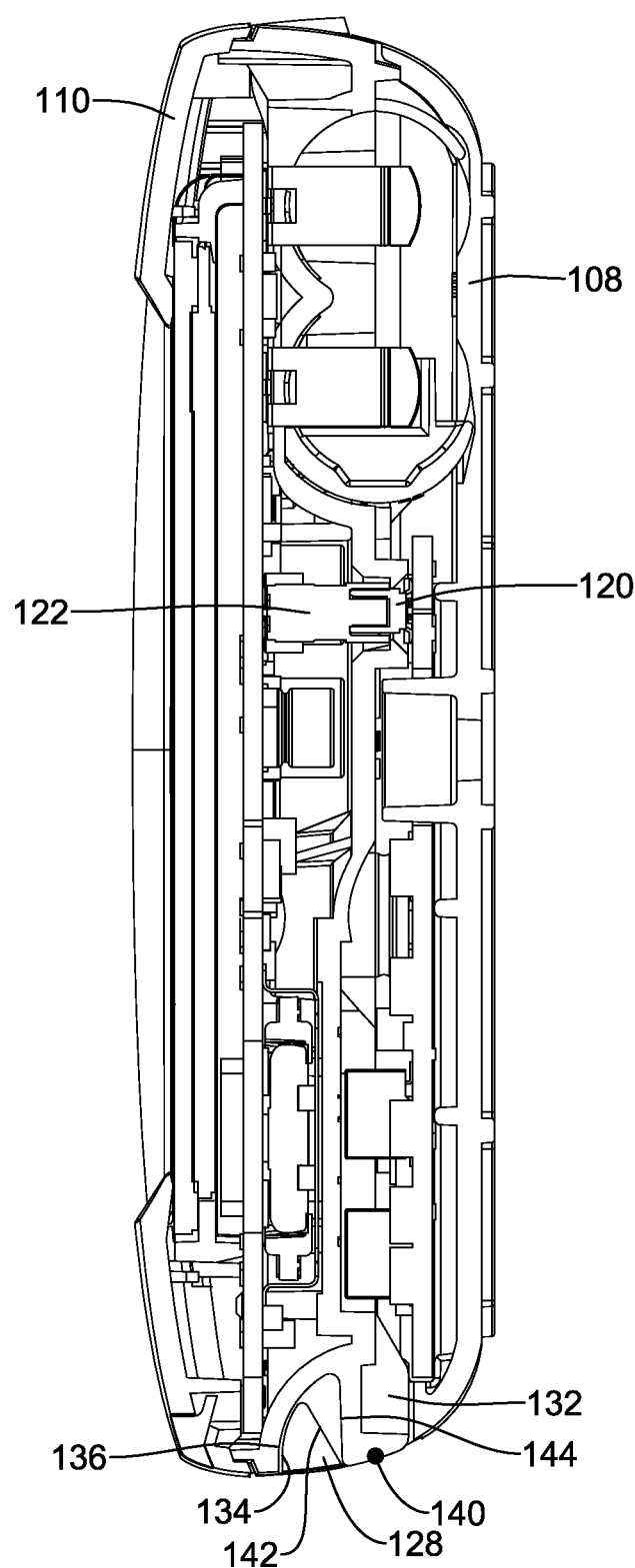
FIG. 4 is a schematic cutaway view of the HVAC controller of FIGS. 1-3 with the controller module secured to the wall plate.

The hinge structures 124, 126 of the example shown in the Figures may include additional cooperating features. Loops 128 of the first hinge structures 124 each include one or more first curved surfaces 134. Second hinge structures 126 may include one or more second curved surfaces 136 spaced apart from the tang 132 by a void 138 (see FIG. 3). When the hinge 129 is assembled, loops 128 generally extend into voids 138 in the controller module 110, concurrent with tangs 132 extending into openings 130 in the loops 128. Details of this arrangement may be best seen in FIGS. 4 and 5, which are schematic cutaway views of HVAC controller 100 with controller module 110 secured to wall plate 108 in FIG. 4, and rotated away from the wall plate in FIG. 5. In FIG. 4, one may appreciate that when hinge structures 124, 126 of the wall plate 108 and controller module 110 are mated and the controller module 110 is secured to the wall plate 108, the structure and fit of the hinge structures may be such that they present a smooth bottom outer surface to the HVAC controller 100, with no sharp projections from the overall outer surface. The perimeter of the HVAC controller 100 may be smooth, without projections from hinge structures disrupting the generally smooth perimeter. In other instances, hinge structures may result in projections from the overall outer surface of the HVAC controller 100, if desired. In some instances, there may be recesses into the controller structure from the overall outer surface to form features of the hinge structure. Perceptually, such recesses may be less visually prominent than projections and subjectively may be less objectionable aesthetically.

First curved surfaces 134 and second curved surfaces 136 may have substantially similar or identical circular curvatures. When the hinge 129 is assembled, with loops 128 generally extending into voids 138 and tangs 132 extending into openings 130, first curved surfaces 134 and second curved surfaces 136 may cooperate such that controller module 110 may rotate or pivot relative to wall plate 108, with first and second curved surfaces generally conforming to each other and sliding smoothly relative to each other in at least partial contact. The curvatures of first curved surfaces 134 and second curved surfaces 136 may define a rotation axis 140 about which controller module 110 may pivot relative to wall plate 108. As illustrated in FIGS. 4 and 5, the rotation axis may be disposed approximately at the surface of the enclosure 102 of HVAC controller 100, but this is merely an example and should not be construed as limiting the scope of the present disclosure. Depending on the particular geometry of the first and second hinge structures 124, 126, the rotation axis may be disposed within controller module 110, it may be disposed on the surface as illustrated, or it may be disposed external to the HVAC controller 100 such that it intersects neither the controller module 110 nor the wall plate 108. In some instances, different and/or non-circular curvatures for either or both of the first and second curves may make possible relative motions between the controller module 110 and wall plate 108 that are more complex than simple rotation about a fixed rotation axis 140. For example, and in some instances, the instantaneous location of the rotation axis 140 may vary, depending on the magnitude of rotational displacement of the controller module 110 relative to the wall plate 108.

The ability to choose the location or locations for the rotation axis 140 through choice of the geometry of the hinge structures, including the curved surfaces, may be valuable to the designers of a controller such as HVAC controller 100. The location of the rotation axis 140 determines, at least in part, how controller module 110 and wall plate 108 can move relative to each other when their motion is constrained by the hinge 129. This may have implications, for example, on how components of the controller module 110 and the wall plate 108 may be dimensioned and positioned to avoid undesired mechanical interference. In other aspects, mechanical interference may be desired. For example, connector portion 120 and connector portion 122 may be attached to and positioned on wall plate 108 and controller module 110, respectively, such that as the controller module 110 is rotated toward or away from the wall plate 108, the connector portions may automatically mate or de-mate, respectively. The locations (radius) of the connector portions 120, 122 relative to the rotation axis 140 generally will affect how the portions move relative to each other during such a rotation. If their radial distance from the rotation axis is smaller, the connector portions 120, 122 rotate more for a given amount of lateral displacement than if their radial distance is greater. The designers of the HVAC controller 100 may design the hinge structures 124, 126 to place the rotation axis 140 relatively further away from the connector portions 120, 122, to allow the connector portions 120, 122 to mate or de-mate with less rotation. In some instances, the relative placement of the connector portions 120, 122 and the rotation axis 140 may allow the connector to mate and de-mate with less than about 4 degrees of rotation of the controller module 110. Alternately, while it may be desirable for many connectors to mate/de-mate with little rotation, some connectors may be intended to be mated with rotation, and the hinge arrangement of an HVAC controller 100 may be designed accordingly.

The hinge structures 124, 126 shown in the Figures include additional features that may affect or constrain the motion of the controller module 110 relative to wall plate 108. For example, the first hinge structures 124 and the second hinge structures 126 are configured such that the resulting hinge 129 provides an end stop that limits the range of rotation of the controller module 110 relative to the wall plate 108. The first hinge structures 124 and the second hinge structures 126 include cooperating features that allow the controller module to rotate relative to the wall plate about the rotation axis 140, but then interfere to provide an end stop for the hinge 129. In the example shown, tangs 132 and loops 128 engage and interfere after a range of rotation about the rotation axis 140 to provide an end stop. Other portions of the first and second hinge structures 124, 126 may contribute to providing the end stop as well. The loops 128 may define openings 130, with the openings 130 defined by inner side walls of the loop 128. One of the inner side walls 142 of loop 128 (perhaps most easily visualized in FIG. 6, which is a schematic perspective view of HVAC controller 100 with controller module 110 pulled away from the wall plate 108), is configured to engage wall 144 of tang 132 to provide the end stop for the hinge 129. As shown in FIG. 5, inner side wall 142 of loop 128 is substantially in contact with wall 144 of tang 132, such that in this position, the end stop is substantially preventing the controller module 110 from rotating further away from the wall plate 108, beyond a defined rotational limit. In FIG. 5, the defined rotational limit is about 30 degrees. With the controller module 110 rotated to the defined rotation limit, the hinge 129 is configured to suspend the controller module 110 at the defined rotation limit, holding it in place against gravity without external support. The end stop of the hinge 129 and suspension of the controller module 110 by the hinge 129 may be provided by other interferences between hinge structures in addition to or instead of the interference between inner side wall 142 of loop 128 and wall 144 of tang 132. One such interference may be between the loop 128 and second curved surface 136.

Configurations of end stops differing from that of the example shown in the Figures are contemplated. For example, the end stop may limit the rotation of the controller module 110 relative to the wall plate 108 to less than 90 degrees, less than 40 degrees, less than 30 degrees, less than 20 degrees, or any other suitable angular value. The end stop feature may be provided in all pairs of cooperating hinge structures of a HVAC controller 100, or it may be provided in only some pairs. Different pairs of cooperating hinge structures of a HVAC controller 100 may be provided with different implementations of end stops. Some illustrative hinges may not include the end stop feature, when so desired.

In some cases, the hinge 129 formed by first hinge structures 124 and second hinge structures 126 may be robustly resistant to damage. At least some of the first hinge structures 124 and the second hinge structures 126 may be structured with sufficient flexibility and/or lubricity that if a force is exerted on the controller module 110 so as to rotate the controller module 110 relative to the wall plate 108 past the end stop, the hinge 129 may release without breakage of any of the first and second hinge structures. The configuration of the first hinge structures 124 of the wall plate 108 and the second hinge structures 126 of the controller module 110 may be such that forcing the controller module 110 to rotate about the rotation axis 140 beyond the end stop temporarily deforms but does not damage the hinge 129 for future use.

While each first hinge structure 124 and each second hinge structure 126 is illustrated as including substantially identical features, this is not necessary. Different cooperating pairs of first and second hinge structures may be configured differently. In addition to potential differences in end-stop structures discussed herein, different cooperating pairs of first and second hinge structures may differ, for example, in their arrangement of first and second curved surfaces, or some may substantially lack curved surfaces that help define a rotation profile, with such definition possibly being provided for the hinge 129 only by other cooperating pairs of first and second hinge structures.

Figure 6:
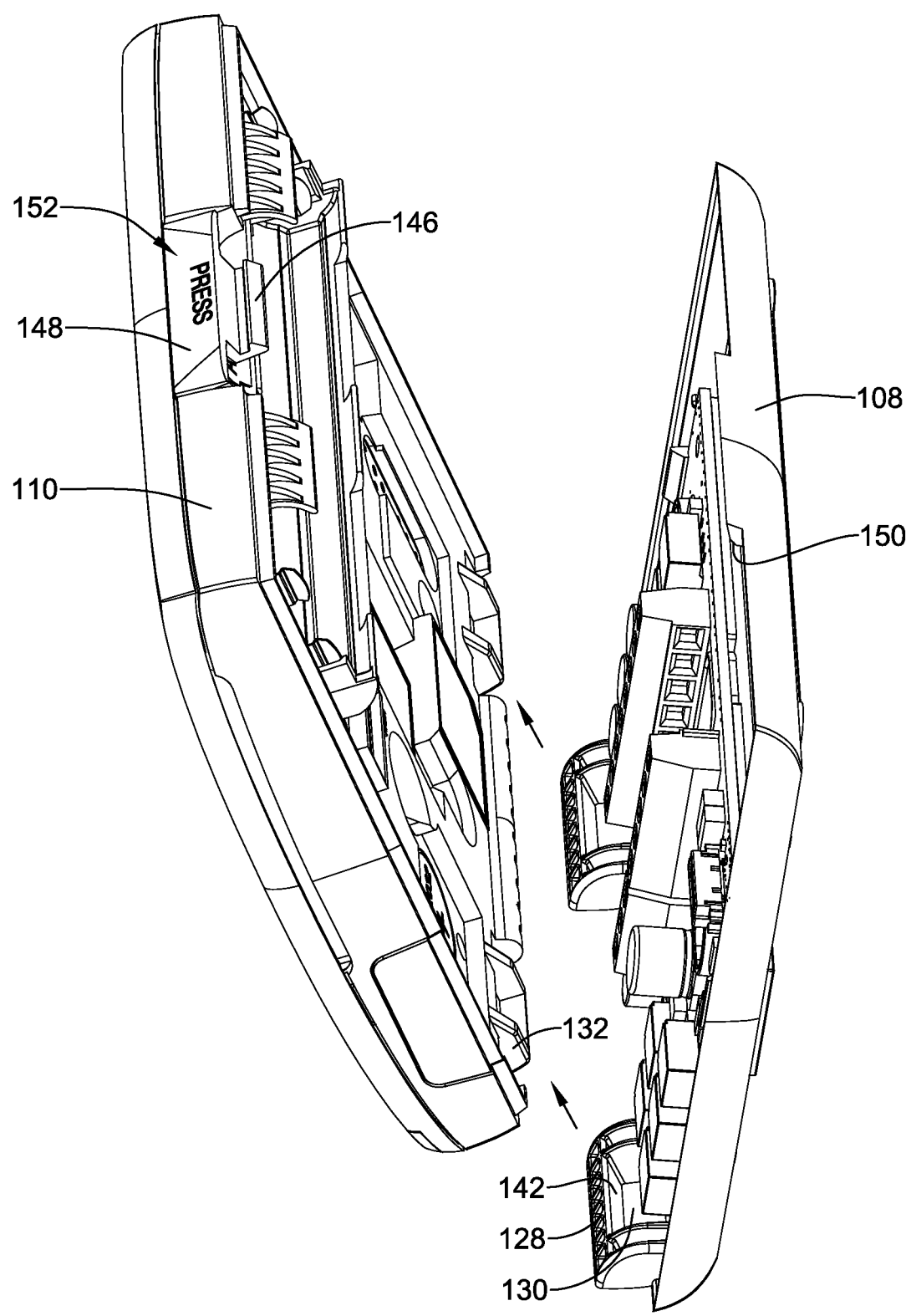
FIG. 6 is a schematic perspective view of the HVAC controller of FIG. 1-5 with the controller module pulled away from the wall plate.

The hinge 129 formed by first and second hinge structures 124, 126 as shown in the Figures may exhibit another feature that makes HVAC controller 100 easy to maintain. The hinge structures 124, 126 are configured such that, if the controller module 110 is not secured to the wall plate 108 by any other mechanism, such as the latch 152 described elsewhere herein, the controller module 110 can be freely pulled away from the wall plate 108 by a user and disengaged from the wall plate 108, as schematically illustrated in FIG. 6. In the orientation shown in FIG. 6, the controller module 110 may be freely lifted up and away from a state of being suspended on the wall plate 108 via the hinge 129. In the embodiment illustrated in the Figures, the controller module 110 may be freely pulled away from the wall plate 108 over a wide range of relative angular displacements while rotating about the rotation axis 140, with such free separability being only restricted at small rotational displacements when the controller module 110 and wall plate 108 are only slightly separated. In some instances, the hinge structures may be configured to allow the controller module 110 and the wall plate 108 to be freely separated over smaller ranges of relative angular displacement, if desired. In some cases, the hinge structures may be configured to allow the controller module 110 and the wall plate 108 to be freely pulled apart only when at or close to the end stop.

In the example shown in the Figures, disengaging the controller module 110 from the wall plate 108 generally entails removing the tangs 132 from the openings 130 of the loops 128, and similarly, removing the loops 128 from the voids 138. In the example shown, the controller module 110 and the wall plate 108 may be freely pulled apart in this fashion over a wide range of relative angular displacements while rotating about the rotation axis 140. Alternatively, it is contemplated that a hinge locking/release mechanism may be provided, which must first be actuated by a user before the controller module 110 can be removed from the wall plate 108.

HVAC controller 100 may include a latch 152, such that controller module 110 may be releasably securable to the wall plate 108 by both the latch 152 and the hinge 129. When secured by the latch 152, the controller module 110 may be in contact with the wall plate 108, often at multiple points, and the combined controller module 110 and wall plate 108 may present a mechanically integral unit. Such a configuration is illustrated in cutaway in FIG. 4. When the controller module 110 is secured to the wall plate 108 by the latch 152 and the hinge 129, releasing the latch 152 allows the controller module 110 to be rotated relative to the wall plate 108 about the rotation axis 140 of the hinge 129 and away from the wall, as shown in FIG. 5. The HVAC controller 100 may be configured with a single latch/release mechanism 152, after actuation of which the controller module 110 may be separated from the wall plate 108 without requiring release of any other securing mechanism. In other instances, multiple latch/release mechanisms may be provided. The latch 152 may be provided in any suitable form.

As illustrated in FIG. 2, the latch 152 may include a hook 146 attached to a release button 148. The hook 146 of the controller module 110 may be structured to engage a slot or notch 150 of the wall plate 108. The latch 152 may be structured such that it may be easily manipulated, such as by a single human finger (e.g., pressing the button 148 down). Any suitable alternative latch or other release mechanism may be employed. For example, a sliding lever may be employed to release a latch 152. Such a mechanism may also be very easy for a human to manipulate with a single finger. The latch 152 may be configured such that it automatically latches when the controller module 110 and wall plate 108 are brought together, for example, by rotation. The latch 152 may be configured in any suitable way. For example, the hook 146 and release button 148 may be disposed on controller module 110 with the slot or notch 150 on the wall plate 108, but this could be reversed. While the latch 152 is illustrated on a top side of the controller module 110 in the Figures, this is not necessary. The latch 152 may be disposed at any suitable location.

The HVAC controller 100 may be particularly user-friendly for an untrained end-user to use and maintain, with removal of the controller module 110 from the wall plate 108 and reinstallation thereon being generally easy and intuitive. In the example shown in the Figures, the release button 148 is shown disposed on the top side of the HVAC controller 100 where it may be easily seen by most users. The button 148 may be pressed easily to release the latch 152, after which the controller module 110 may be rotated away from the wall plate 108 with support from the hand of the end user, or even without support, solely under the influence of gravity. As the controller module 110 rotates away from wall plate 108, connectors between the two (such as the connector of connector portions 120,122) may automatically release. The controller module 110 may be allowed to rotate until reaching the end stop of the hinge 129, where it may remain suspended upon the wall plate 108 without falling to the floor. The user may lift of pull the controller module 110 from the wall plate 108 if desired from the end stop position or at an earlier point of rotational displacement.

Reinstallation of the controller module 110 onto wall plate 108 is also made easy for the end-user. In the example shown, loops 128 and tangs 132 may be sufficiently large and/or visually prominent that their purpose may be self-evident to a majority of typical end users. Loops 128 may extend across a significant percentage of the width of the wall plate 108, such as 5%, 10%, 15%, 20%, 25%, 33%, 40%, or any other suitable value. Loops 128 may protrude away from the wall plate 108 by a significant percentage of the thickness of the wall plate 108 exclusive the loops 128, such as 10%, 20%, 25%, 33%, 50%, 75%, 100%, 150%, 200%, or any other suitable value. Tangs 132 may generally be dimensioned to correspond to loops 128 and accordingly may be of similar visual prominence. An end-user, self-perceiving (or having been instructed as to) the utility of the hinge structures, may intuitively insert the tangs 132 into the openings 130 of the loops 128, then intuitively rotate the controller module 110 toward the wall plate 108. The connector(s) may automatically connect until the latch 152 automatically latches (or is manually latched in some embodiments).

Figure 7:
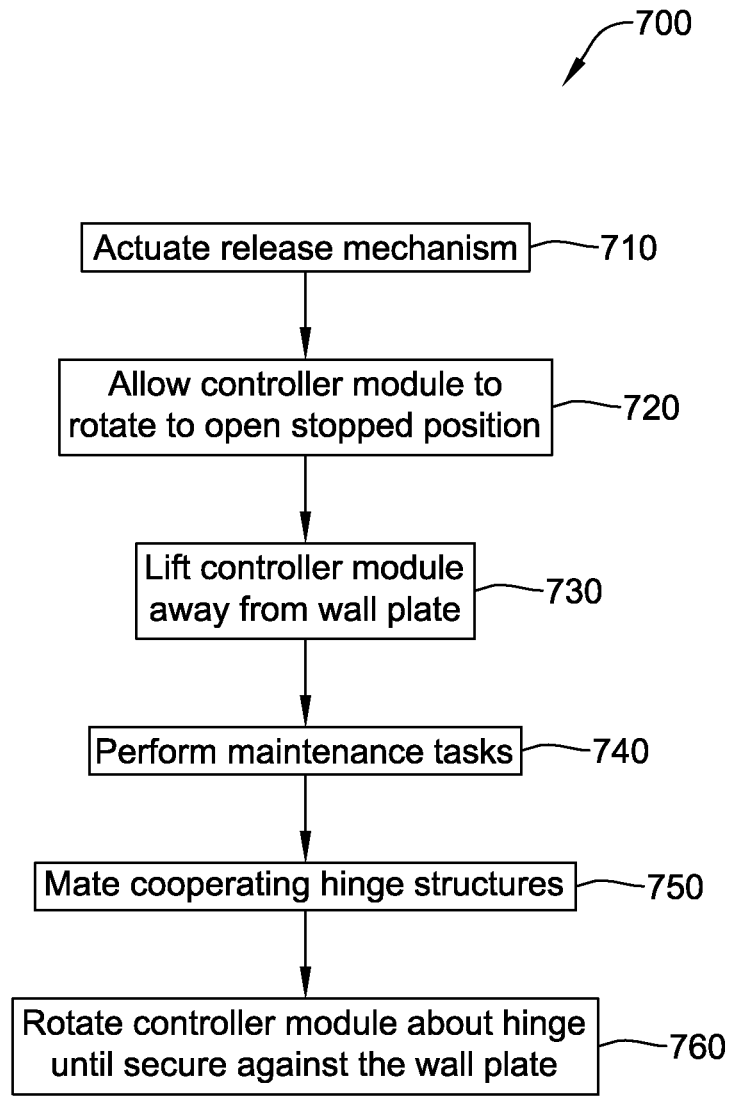
FIG. 7 is a flowchart of an illustrative method 700 of replacing a battery and/or performing other maintenance task on an HVAC controller.

FIG. 7 is a flowchart of an illustrative method 700 of replacing a battery and/or performing other maintenance task in an HVAC controller 100 having a wall plate 108 and a controller module 110 as described herein. Starting from a state with the controller module 110 secured to the wall plate 108 (see FIG. 4), the method may start at 710 with the step of actuating the latch 152 or other release mechanism. In some embodiments, actuating the release mechanism may be performed with a single human finger. After actuating the release mechanism, the controller module 110 may be allowed to rotate to the open stopped position as at step 720 (see FIG. 5). At step 730, the controller module 110 may be lifted away from the wall plate 108 from the open stopped position or from another rotational displacement of the controller module 110 relative to the wall plate 108 (see FIG. 6). After the controller module 110 is lifted away from the wall plate 108, at step 740, maintenance tasks may be performed, such as removing one or more batteries from the controller module 110 and placing one or more new batteries into the controller module 110, and/or programming the controller module 110 via a user interface such as touch screen 106 of the controller module 110. After maintenance is performed, the cooperating hinge structures of the wall plate 108 and the controller module 110 may be mated at step 750, and the controller module 110 may be rotated about the hinge 129 until the controller module 110 is secure against the wall plate 108 via the latch 152 or other release mechanism at step 760.

The disclosure should not be considered limited to the particular examples described above, but rather should be understood to cover all aspects of the disclosure and equivalents thereof. Various modifications, equivalent processes, as well as numerous structures to which the disclosure can be applicable will be readily apparent to those of skill in the art upon review of the instant specification.

What is claimed is:

1. A wall-mountable HVAC controller comprising:
    a wall plate including one or more first hinge structures, the wall plate configured to be secured to a wall;
    a controller module configured to be releasably securable to the wall plate, the controller module including one or more second hinge structures configured to engage the one or more first hinge structures to form a hinge between the controller module and the wall plate, wherein the hinge enables the controller module to rotate away from the wall plate along a predetermined path and away from the wall to an end stop defined by the one or more hinge structures; and
    a latch configured to be releasable by a user in order to release a top of the controller module from the wall plate without having to first pull the controller module away from the wall plate;
    wherein the one or more first hinge structures of the wall plate and the one or more second hinge structures of the controller module are configured to allow rotation of the controller module away from the wall plate while the one or more first hinge structures remain engaged with the one or more second hinge structures;
    wherein the controller module is securable to the wall plate by both the latch and the hinge, wherein when the controller module is secured to the wall plate by the latch and the hinge, releasing the latch by the user allows the controller module to be rotated away from the wall plate via the hinge; and
    wherein the one or more first hinge structures of the wall plate and the one or more second hinge structures of the controller module are configured such that, after the latch releases the controller module from the wall plate, the controller module can be freely pulled away by the user and disengaged from the wall plate.

2. The wall-mountable HVAC controller of claim 1, wherein the controller module is configured to rotate away from the wall plate about a rotation axis, wherein the rotation axis does not intersect the wall plate nor the controller module.

3. The wall-mountable HVAC controller of claim 1, wherein the one or more first hinge structures of the wall plate and the one or more second hinge structures of the controller module include cooperating features that allow the controller module to rotate away from the wall plate but then interfere to define the end stop for the hinge, the end stop substantially preventing the controller module from rotating relative to the wall plate beyond a defined rotational limit.

4. The wall-mountable HVAC controller of claim 3, wherein the one or more first hinge structures of the wall plate and the one or more second hinge structures of the controller module are positioned adjacent a bottom side of the wall-mounted HVAC controller and the latch is positioned adjacent a top side of the wall-mounted HVAC controller, and wherein the hinge is configured to suspend the controller module at the defined rotation limit when the controller module is rotated to the defined rotation limit.

5. The wall-mountable HVAC controller of claim 1, wherein at least some of the one or more first hinge structures and the one or more second hinge structures are structured with sufficient flexibility and/or lubricity that if a force is exerted on the controller module so as to rotate the controller module away from the wall plate past the end stop, the hinge releases without breakage of any of the one or more first hinge structures and the one or more second hinge structures.

6. The wall-mountable HVAC controller of claim 1, wherein the one or more first hinge structures and the one or more second hinge structures include:
    a loop defining an opening, the opening defined by inner side walls of the loop, the loop including a first curved surface;
    a tang; and
    a second curved surface spaced from the tang,
    wherein the tang is configured to extend into the opening of the loop, with the first curved surface of the loop cooperating with the second curved surface,
    wherein one of the inner side walls of the loop is configured to engage the tang to at least partially define the end stop for the hinge.

7. The wall-mountable HVAC controller of claim 6, wherein after the latch releases the controller module from the wall plate, the controller module can be freely pulled away by the user and disengaged from the wall plate by removing the tang from the opening of the loop.

8. A wall-mountable HVAC controller comprising:
    a wall plate having an upper half and a lower half, the wall plate including one or more first hinge structures in the lower half of the wall plate, the wall plate configured to be secured to a wall; and
    a controller module configured to be releasably securable to the wall plate and including an upper half and a lower half, the controller module including one or more second hinge structures in the lower half of the controller module configured to engage the one or more first hinge structures to form a hinge between the controller module and the wall plate, wherein the hinge allows the controller module to rotate away from the wall plate and away from the wall; and
    a connector for electrical and/or optical signals, the connector including a first connector portion attached to the upper half of the wall plate and a second connector portion attached to the upper half of the controller module, the first connector portion and second connector portion configured to automatically mate and de-mate as the controller module is rotated toward and away from the wall plate, respectively,
    wherein the one or more first hinge structures of the wall plate and the one or more second hinge structures of the controller module are configured such that, while rotating away from the wall plate, the controller module can be freely pulled away by the user and disengaged from the wall plate; and
    wherein the one or more first hinge structures of the wall plate and the one or more second hinge structures of the controller module are configured such that the hinge provides an end stop that limits the rotation of the controller module away from the wall plate such that when the wall plate is mounted to the wall, the controller module is rotatable under gravity until engaging the end stop.

9. The wall-mountable HVAC controller of claim 8, wherein the controller module is configured to rotate away from the wall plate about a rotation axis, wherein the rotation axis does not intersect the wall plate nor the controller module.

10. The wall-mountable HVAC controller of claim 8, wherein the controller module is securable to the wall plate by both a latch and the hinge, wherein when the controller module is secured to the wall plate by the latch and the hinge, releasing the latch allows the controller module to be rotated away from the wall plate via the hinge and away from the wall.

11. The wall-mountable HVAC controller of claim 8, wherein the end stop limits the rotation of the controller module away from the wall plate to less than 90 degrees.

12. The wall-mountable HVAC controller of claim 8, wherein the end stop limits the rotation of the controller module away from the wall plate to less than 40 degrees.

13. The wall-mounted HVAC controller of claim 8, wherein the one or more first hinge structures of the wall plate and the one or more second hinge structures of the controller module are configured such that forcing the controller module to rotate away from the wall plate beyond the end stop temporarily deforms but does not damage the hinge for future use.

14. The wall-mountable HVAC controller of claim 8, wherein the wall plate includes one or more terminals, the one or more terminals configured to receive a signal-carrying cable from external the HVAC controller, the one or more terminals communicatively coupled to the first connector portion of the connector.

15. A method of engaging and disengaging a control module from a wall plate of an HVAC controller, the wall plate and the controller module having cooperating hinge structures that form a hinge with an open stopped position that allows the controller module to be suspended from the wall plate at the open stopped position after a release mechanism is actuated, the hinge further allowing the suspended controller module to be lifted freely from the wall plate, the method comprising:

with the controller module secured to the wall plate, actuating the release mechanism;

after actuating the release mechanism, allowing the controller module to rotate about the hinge to the open stopped position, wherein while the controller module is rotated to the open stopped position, one or more control signal connections between the controller module and the wall plate become disrupted;

lifting the controller module away from the wall plate from the open stopped position;

mating the cooperating hinge structures of the wall plate and the controller module; and rotating the controller module about the hinge until the controller module is secure against the wall plate via the release mechanism, wherein while the controller module is rotated and then secured against the wall plate via the release mechanism, reestablishing the one or more control signal connections between the controller module and the wall plate.

16. The method of claim 15 further comprising:

after lifting the controller module away from the wall plate from the open stopped position, removing one or more batteries from the controller module and placing one or more new batteries into the controller module.

17. The method of claim 15 further comprising:

after lifting the controller module away from the wall plate from the open stopped position, programming the controller module via a user interface of the controller module.

18. The method of claim 15, wherein actuating the release mechanism includes actuating the release mechanism with a single human finger.

19. The wall-mountable HVAC controller of claim 8, wherein the first connector portion and second connector portion are configured to automatically mate and de-mate as the controller module is rotated through less than 4 degrees of rotation.

* * * * *